United States Patent [19]

Mueller

[11] Patent Number: 4,777,447

[45] Date of Patent: Oct. 11, 1988

[54] METHOD AND APPARATUS FOR A DIGITAL DIFFERENCE FREQUENCY MIXER

[75] Inventor: Martin Mueller, Munich, Fed. Rep. of Germany

[73] Assignee: Siemens Aktiengesellschaft, Berlin and Munich, Fed. Rep. of Germany

[21] Appl. No.: 895,024

[22] Filed: Aug. 8, 1986

[30] Foreign Application Priority Data

Sep. 12, 1985 [DE] Fed. Rep. of Germany ....... 3532619

[51] Int. Cl.⁴ .................... H03K 9/06; H03K 19/00
[52] U.S. Cl. .................................... 328/133; 307/271; 307/479; 307/525; 328/140
[58] Field of Search ............... 307/271, 479, 471, 522, 307/525; 328/133, 140

[56] References Cited

U.S. PATENT DOCUMENTS

| | | | |
|---|---|---|---|
| 3,354,398 | 11/1967 | Broadhead, Jr. | 307/525 |
| 3,448,389 | 6/1969 | Suzuki et al. | 328/133 |
| 3,509,476 | 4/1970 | Roth | 307/479 |
| 3,526,841 | 9/1970 | Holmboe | 328/133 |
| 3,656,063 | 4/1972 | Vollmer | 328/133 |
| 3,735,324 | 5/1973 | Phillips | 328/133 |
| 3,866,129 | 2/1975 | Cornelissen | 328/133 |

FOREIGN PATENT DOCUMENTS 2750476 5/1979 Fed. Rep. of Germany.
3130177 2/1983 Fed. Rep. of Germany.

Primary Examiner—Stanley D. Miller
Assistant Examiner—Richard Roseen
Attorney, Agent, or Firm—Lawrence C. Edelman

[57] ABSTRACT

In a digital difference-frequency mixer equipped with a bistable trigger stage, the following gates are proposed: a first EXOR-gate to which a first signal and a second signal are directly applied, a second EXOR-gate to which these two signals are applied each delayed by one quarter period, a first AND-gate to which the output signals of the first EXOR-gate and the second EXOR-gate are directly applied, a second AND-gate to which these output signals are applied in inverted form and an RS-flip-flop. The output signal of the first AND-gate is applied to the set pulse input of the RS-flip-flop and the output signal of the second AND-gate is applied to the reset pulse input of the RS-flip-flop.

4 Claims, 1 Drawing Sheet

METHOD AND APPARATUS FOR A DIGITAL DIFFERENCE FREQUENCY MIXER

BACKGROUND OF THE INVENTION

1. Field of the Invention

The invention relates to a method and apparatus for obtaining a difference-frequency mixer.

2. Description of the Prior Art

From two binary input signals with given frequencies, digital difference-frequency mixers produce a binary output signal having a frequency corresponding to the difference in frequency of the two input signals. Digital difference-frequency mixers of this kind are used, for example, in a data multiplexer for a radio relay device in which the relationship between two data clock signals is to be analyzed.

A frequency mixer which primarily emits an output signal corresponding to the frequency difference of its input signals is disclosed in German patent publication No. OS 31 30 177. In this disclosed type of frequency mixer, which consists of a D-type flip-flop, the frequencies of the input signals are permitted to differ only slightly from one another.

SUMMARY OF THE INVENTION

An object of the present invention is to provide a method and apparatus for obtaining a digital difference-frequency signal in which the frequencies of the input signals are not subject to such special restrictions.

This object, as well as other objects which will become apparent from the discussion that follows, are achieved according to the invention, by a method and apparatus for obtaining a digital difference-frequency signal at the output of a bistable trigger stage which has a frequency which is equal to the difference value between the frequency of a first signal and the frequency of a second signal. Initially, the first and second signals are combined in a logic exclusive-or (EXOR) manner without a delay for forming a first logic signal of a first type. Then, the first and second signals are each delayed by an amount corresponding to one-quarter of their respective periods, and also combined in a logic EXOR manner for forming a second logic signal of the first type. Next, the first and second logic signals of the first type are combined in a logic AND manner, on the one hand without signal inversion of the first and second logic signals of the first type and on the other hand with signal inversion of the first and the second logic signals of the first type, for forming first and second logic signals of a second type. Then, one of the first and second logic signals of the second type are applied to a set-pulse input of the bistable trigger stage and the other of the first and second of the logic signals of the second type are applied to a reset-pulse input of the bistable trigger stage.

For a better understanding of the advantages and embodiments of the present invention, reference should now be made to the following detailed description of a preferred embodiment of the invention and its accompanying drawing.

BRIEF DESCRIPTION OF THE DRAWING

An exemplary and non-limiting preferred embodiment of the invention is shown in the drawing, in which.

DETAILED DESCRIPTION OF THE PREFERRED EMBODIMENT

Figure 1:
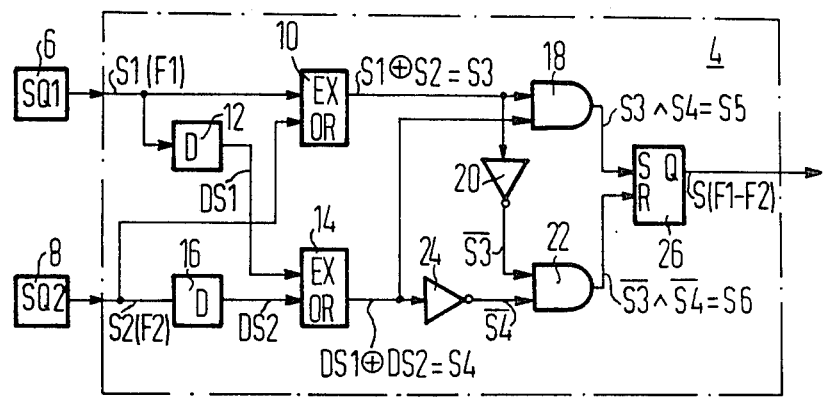
FIG. 1 illustrates in block diagram form a digital difference-frequency mixer constructed in accordance with the principles of the invention.

FIG. 1 represents a digital difference-frequency mixer 4 constructed in accordance with the principles of invention which is supplied by a first signal source 6 with a first signal S1 having a frequency F1 and by a second signal source 8 with a second signal S2 having a frequency F2. The signals S1 and S2 consist of binary, rectangular pulse, sequences.

Figure 2:
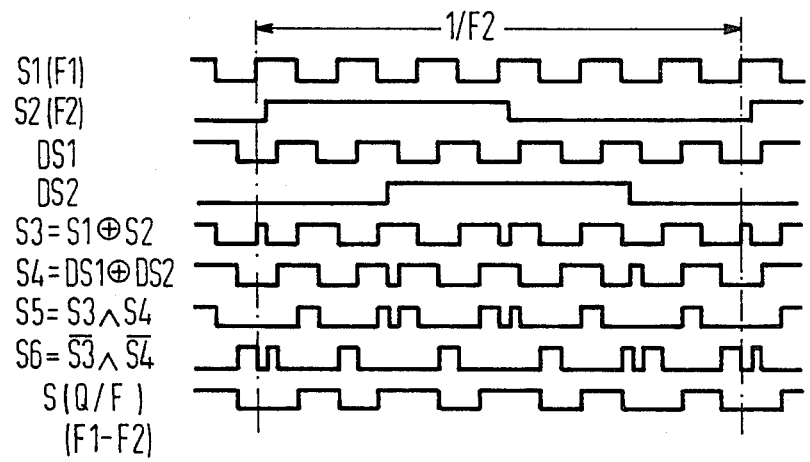
FIG. 2 illustrates pulse sequences on some of the lines of the difference-frequency mixer of FIG. 1.

When referring to FIG. 2, the broken vertical lines mark one period of second signal S2 with the value 1/F2. To simplify the explanation of the difference-frequency mixer in accordance with the invention, the frequency F1 of first signal S1 has been selected to represent a multiple of the frequency F2 of second signal S2. It should be noted, however, that this does not represent an essential condition.

First signal S1 is applied to the first input of a first EXOR-gate 10 and, via a first delay (D) stage 12, is applied as first delayed signal DS1 to the first input of a second EXOR-gate 14. Second signal S2 is applied to the other input of first EXOR-gate 10 and, via a second delay (D) stage 16, is applied as a second delayed signal DS2 to the other input of second EXOR-gate 14. The delay time of first delay stage 12 amounts to one-quarter period of first signal S1 and the delay time of second delay stage 16 amounts to one quarter period of second signal S2.

A third signal S3, which is emitted from the output of EXOR-gate 10 and which corresponds to the modulo-2-sum of the first S1 and second S2 signals, is applied to the first input of a first AND-gate 18 and, via a first inverter 20, is applied as an inverted third signal $\overline{S3}$ to the first input of a second AND-gate 22. A fourth signal S4, which is emitted from the output of second EXOR-gate 14 and which corresponds to the modulo-2-sum of the dealyed first S1 and delayed second S2 signals, is applied to the other input of first AND-gate 18 and, via a second inverter 24, is applied as a inverted fourth signal $\overline{S4}$ to the other input of second AND-gate 22.

In an arbitrary interval, the duration of which is equal to the period of the second signal S2 with the value 1/F2, the third S3 and fourth S4 signals comprise one positive-going and one negative-going edge more than the first signal S1. Therefore, the third S3 and fourth S4 signals have a frequency which corresponds to the sum frequency of the frequency of first signal S1 and the frequency of second signal S2.

A fifth signal S5, which is emitted from the output of first AND-gate 18 and which corresponds to a logic AND of the third S3 and fourth S4 signals, is applied to a set pulse input S of an RS-flip-flop (bistable trigger stage) 26. A sixth signal S6, which is emitted from the output of second AND-gate 22 and which corresponds to the logic AND of the inverted third $\overline{S3}$ and inverted fourth $\overline{S4}$ signals, is applied to a reset-pulse input R of RS-flip-flop 26. From an output Q of RS-flip-flop 26 an output signal S is emitted, the frequency of which is equal to the difference value between the frequencies of first signal S1 and second signal S2.

In the case of the fifth S5 and sixth S6 signals, the pulses of one of the signals fall in the gap between the pulses of the other signal, with the exception of the gap between the double pulses which occur twice during the 1/F2 interval. Since the fifth signal S5 is applied to the set-pulse input S and the sixth signal S6 is applied to the reset-pulse input R of RS-flip-flop 26, the double pulses of each signal each serve only once as a respective one of the set or reset pulses. For this reason, in an arbitrary interval having a duration of 1/F2, the output signal S contains one positive-going and one negative-going edge less than the first signal S1. Therefore, the frequency of the output signal S is the desired difference-frequency F1−F2 between the frequency F1 of first signal S1 and the frequency F2 of second signal S2.

There has thus been shown and described a novel method and apparatus for producing a digital difference-frequency mixer which fulfills all the objects and advantages sought therefore. Many changes, modifications, variations and other uses and applications of the subject invention will, however, become apparent to those skilled in the art after considering this specification and the accompanying drawings which disclose a preferred embodiments thereof. For example, the fifth signal S5 could be applied to the reset-pulse input R of RS-flip-flop 26 and the sixth signal S6 could be applied to its set-pulse input S. All such changes, modifications, variations and other uses and applications which do not depar from the spirit and scope of the invention are deemed to be covered by the invention which is limited only by the following claims.

What is claimed is:

1. A method for obtaining a digital difference-frequency signal with a frequency which is equal to the difference value between the frequency of a first signal and the frequency of a second signal, using a bistable trigger stage, the difference-frequency signal being obtained from an output of the bistable trigger stage, which method comprises:
    combining said first and said second signals in a logic exclusive-or (EXOR) manner, on the one hand without delaying of said first and second signals and on the other hand with delaying each of said first and second signals by an amount corresponding to one-quarter of its period, for forming first and second logic signals of a first type, respectively;
    combining said first and said second logic signals of said first type in a logic AND manner, on the one hand without signal inversion of said first and said second logic signals of said first type and on the other hand with signal inversion of said first and said second logic signals of said first type, for forming first and second logic signals of a second type; and
    applying one of said first and second logic signals of said second type to a set-pulse input of said bistable trigger stage and applying the other of said first and second of said logic signals of said second type to a reset-pulse input of said bistable trigger stage.

2. The method of claim 1, wherein:
    said first and second logic signals of said second type are applied to the set-pulse and reset-pulse inputs, respectively, of said bistable trigger stage.

3. A digital difference-frequency mixer including a bistable trigger stage from which can be supplied an output signal with a frequency which is equal to the difference value between the frequency of a first signal and the frequency of a second signal, comprising:
    a first EXOR-gate having inputs to which said first signal and said second signal are applied and an output for providing output signals;
    delay means for providing delayed versions of each of said first and second signals, the delay imparted to each of said first and second signals being one quarter of its period;
    a second EXOR-gate having inputs to which said delayed version of said first signal and said delayed version of said second signal are applied and an output for providing output signals;
    a first AND-gate having inputs to which the output signals of said first EXOR-gate and said second EXOR-gate are applied and an output;
    inverting means coupled to the outputs of said first and second EXOR-gates for generating inverted output signals of said first and second EXOR-gates;
    a second AND-gate having inputs to which the inverted output signals of the first and second EXOR-gates are applied and an output; an
    an RS-flip-flop as said bistable trigger stage having a set-pulse input coupled to the output of one of the first and second AND-gates and a reset-pulse input coupled to the output of the other of the first and second AND-gates.

4. A digital difference-frequency mixer according to claim 3, wherein:
    the outputs of said first and second AND-gates are coupled to said set-pulse and reset-pulse inputs, respectively, of said RS-flip-flop.

* * * * *